US008453019B2

(12) United States Patent
Newcomb et al.

(10) Patent No.: US 8,453,019 B2
(45) Date of Patent: May 28, 2013

(54) METHOD AND SYSTEM FOR A FREE RUNNING STROBE TOLERANT INTERFACE

(75) Inventors: Russell Newcomb, Morgan Hill, CA (US); William B. Simms, San Jose, CA (US); Ting-Sheng Ku, San Jose, CA (US); Ashfaq R. Shaikh, San Jose, CA (US)

(73) Assignee: NVIDIA Corporation, Santa Clara, CA (US)

(*) Notice: Subject to any disclaimer, the term of this patent is extended or adjusted under 35 U.S.C. 154(b) by 342 days.

(21) Appl. No.: 11/983,088

(22) Filed: Nov. 6, 2007

(65) Prior Publication Data
US 2009/0119532 A1    May 7, 2009

(51) Int. Cl.
*G06F 11/00*    (2006.01)
*G11B 20/20*    (2006.01)

(52) U.S. Cl.
USPC ........................................................ 714/704

(58) Field of Classification Search
USPC ............................................ 714/700, 704
See application file for complete search history.

(56) References Cited

U.S. PATENT DOCUMENTS

| | | |
|---|---|---|
| 3,940,740 A | 2/1976 | Coontz |
| 4,541,075 A | 9/1985 | Dill et al. |
| 4,773,044 A | 9/1988 | Sfarti et al. |
| 4,885,703 A | 12/1989 | Deering |
| 4,951,220 A | 8/1990 | Ramacher et al. |
| 4,985,988 A | 1/1991 | Littlebury |
| 5,036,473 A | 7/1991 | Butts et al. |
| 5,125,011 A | 6/1992 | Fung |
| 5,276,893 A | 1/1994 | Savaria |
| 5,379,405 A | 1/1995 | Ostrowski |
| 5,392,437 A | 2/1995 | Matter et al. |
| 5,448,496 A | 9/1995 | Butts et al. |
| 5,455,536 A * | 10/1995 | Kono et al. ................... 329/325 |
| 5,705,938 A | 1/1998 | Kean |
| 5,884,053 A | 3/1999 | Clouser et al. |
| 5,896,391 A * | 4/1999 | Solheim et al. ............... 714/704 |
| 6,249,288 B1 | 6/2001 | Campbell |
| 6,348,811 B1 | 2/2002 | Haycock et al. |
| 6,388,590 B1 | 5/2002 | Ng |

(Continued)

FOREIGN PATENT DOCUMENTS

WO    2004030127    4/2004

OTHER PUBLICATIONS

Zorian, "Test Requirements for Embedded Core-based Systems and IEEE P1500", International Test Conference, copyright IEEE 1997.

(Continued)

*Primary Examiner* — James C Kerveros (57) ABSTRACT

A method of receiving data. A plurality of data signals and clocking signals are received over a source synchronous communication channel. The plurality of data signals is strobed with the clocking signal at a plurality of coarse time offset delays (e.g., time offset delays spanning over a data bit period). The plurality of error rates associated with the strobing at the plurality of coarse time offset delays is determined. Strobing design of a transmitting component (e.g., edge-strobed, center-strobed, etc.) may be determined based on the plurality of error rates. The error rates of the plurality of data signals strobed with a plurality of time offset delays close to the determined strobing design of the transmitting component is calculated. A time offset delay is selected based on the error rates. The plurality of data signals can be strobed with the selected time offset delay to recover the transmitted data signals.

21 Claims, 7 Drawing Sheets

U.S. PATENT DOCUMENTS

| | | |
|---|---|---|
| 6,519,302 B1 * | 2/2003 | Bruce et al. ............... 375/355 |
| 6,701,466 B1 * | 3/2004 | Fiedler ....................... 714/699 |
| 7,058,738 B2 | 6/2006 | Stufflebeam, Jr. |
| 7,069,458 B1 * | 6/2006 | Sardi et al. ................ 713/401 |
| 7,136,953 B1 | 11/2006 | Bisson et al. |
| 7,170,315 B2 | 1/2007 | Bakker et al. |
| 7,246,274 B2 * | 7/2007 | Kizer et al. ................ 714/704 |
| 7,324,458 B2 | 1/2008 | Schoenborn et al. |
| 7,340,541 B2 | 3/2008 | Castro et al. |
| 7,415,551 B2 | 8/2008 | Pescatore |
| 2002/0005729 A1 | 1/2002 | Leedy |
| 2002/0026623 A1 | 2/2002 | Morooka |
| 2002/0031025 A1 | 3/2002 | Shimano et al. |
| 2002/0158869 A1 | 10/2002 | Ohba et al. |
| 2003/0020173 A1 | 1/2003 | Huff et al. |
| 2003/0046472 A1 | 3/2003 | Morrow |
| 2003/0051091 A1 | 3/2003 | Leung et al. |
| 2003/0061409 A1 | 3/2003 | RuDusky |
| 2003/0093506 A1 | 5/2003 | Oliver et al. |
| 2003/0115500 A1 | 6/2003 | Akrout et al. |
| 2003/0164830 A1 | 9/2003 | Kent |
| 2004/0012082 A1 | 1/2004 | Dewey et al. |
| 2005/0044284 A1 | 2/2005 | Pescatore |
| 2005/0237083 A1 | 10/2005 | Bakker et al. |
| 2005/0246460 A1 | 11/2005 | Stufflebeam |
| 2006/0190663 A1 | 8/2006 | Lu |

OTHER PUBLICATIONS

Sgroi et al., "Addressing the System-on-a-Chip Interconnect Woes Through Communication Based Design", DAC 2001, Jun. 18-22, 2001, copyright ACM.

* cited by examiner

METHOD AND SYSTEM FOR A FREE RUNNING STROBE TOLERANT INTERFACE

TECHNICAL FIELD

The embodiments of the present invention relate to the field of electronics. More particularly, embodiments of the present invention relate to a method and system for receiving data from a source that provides both clock and data.

BACKGROUND ART

Communication between different electronic components usually requires the receiving component to sample and strobe the received signal. The increasing amount of data and the speed by which data is moved to and from various components has pushed the uppermost bounds of performance. In order to mitigate the performance limitations, source synchronous architecture has been used. In general, in a source synchronous architecture the transmitting component produces its own clock signal that travels in parallel with the data signal. Theoretically the clocking signals suffer from the same delay and the same drift as the data signals.

Unfortunately, as electronic components become smaller and faster, they become more prone to signal jitter, which causes degradation in data signals and clocking signals. Noise coupling effects within electronic devices produces jitter which is further magnified by lower transistor threshold voltages and large current transients during switching. Moreover, additional jitter is introduced in response to temperature changes. Jitter causes signal delay, signal drift and other inaccuracies to the system.

Different strobing techniques have been utilized in a source synchronous architecture. Two common strobing techniques include a center-strobing and an edge-strobing technique. A source transmitter determines the strobing technique.

Figure 1:
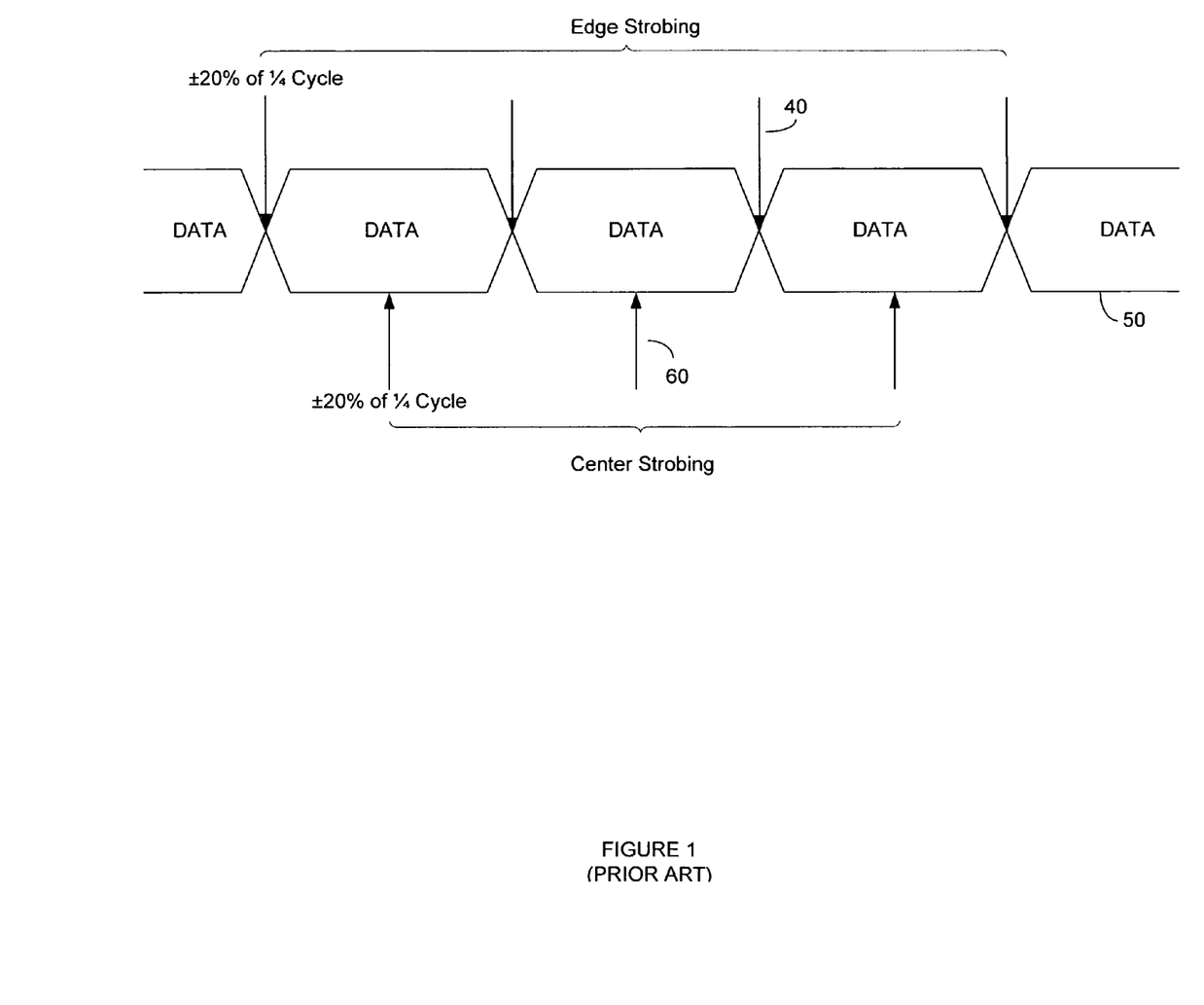
FIG. 1 shows a center-strobe and an edge-strobe signal technique for source synchronous communication.

Referring now to FIG. 1, a center strobing technique and an edge-strobing technique have been shown. An edge-strobing technique strobes data with clocking signals 40 when the data signal 50 is transitioning (e.g., when data transitions from a high to a low and vice versa). In contrast, a center-strobing technique strobes data with clocking signals 60 at the center of each data bit (e.g., midpoint).

Unfortunately the conventional method requires the receiving component to be aware a priori of the strobing design of the transmitting component such that the transmitted data can be recovered. However, various components use different strobing techniques and knowledge of the strobing design of the transmitting component is not always possible. Moreover, the receiving component may need a strobing design that is different from the strobing design of a transmitting component. As such, strobing incompatibility in source synchronous systems is a problem.

SUMMARY

Accordingly, a need has arisen for a method and system to recover received data signals without requiring the receiving component to be aware of the strobing design of the transmitting component. Furthermore, it is advantageous to strobe data signals at any given point within a data bit to compensate for the most severe inaccuracies in the system. It will become apparent to those skilled in the art after reading the detailed description of the present invention that the embodiments of the present invention satisfy the above mentioned needs.

In one embodiment of the present invention, the receiving component of a source synchronous communication system receives data signals along with clocking signals from a transmitting component in a source synchronous communication channel. It is appreciated that the receiving component is unaware of the strobing design of the transmitting component. According to one embodiment, the initial received data signals are known as training signals.

The receiver in accordance with embodiments of the present invention automatically determines the strobing technique or protocol of the source. A sampler of the receiver unit may strobe the received data signals with the clocking signals at different coarse time offset delays. According to one embodiment of the present invention, coarse time offset delays are different time delay offsets within a bit period. For example, the coarse time offset delays may be four strobing points separated a quarter of a bit period from one another.

Based on strobing data signals, a processor may determine error rates associated with each of the coarse time offset delays. The error rates may be used to automatically identify the strobing design of the transmitting component, e.g., as either edge or center strobe. For example, when the error rate is low at approximately the middle of data bit, the strobing design of the transmitting component may be determined as center-strobe. In contrast, when the error rate is low at approximately the transitioning point of data signals, the strobing design of the transmitting component may be determined as edge-strobe. It is appreciated that the determination of the strobing design is based on a large enough sample of data signal to statistically provide an accurate determination.

According to one embodiment once the strobing protocol is determined, training can occur. During training, a controller is operable to control a plurality of fine time offset delays close to the strobing design of the transmitting component. For example, when the strobe design of the transmitting component is determined to be center-strobe, the controller may control a plurality of time offset delays close to the middle of each data signal. A delay component may be used to generate the plurality of fine time offset delays in response to the controller.

Data signals may be strobed with the clocking signals at the plurality of time offset delays. Accordingly, error rates associated with each of the plurality of time offset delays again may be determined. Accordingly, the time offset delay that generates the lowest error rate or an error rate that is within an acceptable threshold may be chosen. As a result, the clocking signals may be offset based on the determined time offset delay to recover the received data signals. In one embodiment, the threshold may be user-selected or predetermined.

Therefore, the receiving component automatically determines the strobing design of the transmitting component, thereby eliminating incompatibilities between the receiving component and the transmitting component. Therefore, embodiments of the present invention provide compatibility between different strobing designs used by sending and receiving components. Additionally, inaccuracies in the system may be further compensated by fine adjustments of the time offset delay of the clocking signals during a training phase.

More specifically, embodiments of the present invention pertain to a method of receiving data including receiving a plurality of data signals and clocking signals from a transmitting component over a source synchronous communication channel; strobing the plurality of data signals with the clocking signal at a plurality of coarse time offset delays within a bit period; determining a plurality of error rates associated with said strobing the plurality of data signals with the clocking signals at the plurality of coarse time offset delays; based on the plurality of error rates, automatically determining a strobing design of the transmitter component; and using the strobing design, recovering data from the data signals.

Embodiments include the above and wherein the strobing design of the transmitter component is selected from a group consisting of an edge-strobe design and a center-strobe design. According to one embodiment, the recovering includes strobing the plurality of data signals with the clocking signals at a plurality of fine time offset delays close to the determined strobing design of the transmitting component; determining a plurality of error rates associated with the strobing the plurality of data signals with the clocking signals at the plurality of fine time offset delays; selecting a time offset delay based on the plurality of error rates associated with the strobing the plurality of data signals with the clocking signals at the plurality of fine time offset delays; and strobing the data signals with the clocking signals at the selected fine time offset delay.

In one embodiment, the selected fine time offset delay generates the lowest error rate in comparison to the remainder of the plurality of fine time offset delays. According to one embodiment, the selected fine time offset delay generates an error rate within a given threshold. The threshold may be user selected and/or predetermined.

BRIEF DESCRIPTION OF THE DRAWINGS

Embodiments of the present invention are illustrated by way of example, and not by way of limitation, in the figures of the accompanying drawings and in which like reference numerals refer to similar elements and in which.

DETAILED DESCRIPTION

Reference will now be made in detail to embodiments of the present invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be evident to one of ordinary skill in the art that the present invention may be practiced without these specific details. In other instances, well known methods, procedures, components, and circuits have not been described in detail as not to unnecessarily obscure aspects of the invention.

Notation and Nomenclature

Some portions of the detailed descriptions which follow are presented in terms of procedures, steps, logic blocks, processing, and other symbolic representations of operations on data bits that can be performed on computer memory. These descriptions and representations are the means used by those skilled in the art to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities.

Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "creating" or "transferring" or "executing" or "determining" or "instructing" or "issuing" or "halting" or "clearing" or "accessing" or "aggregating" or "obtaining" or "selecting" or "calculating" or "measuring" or "querying" or "receiving" or "sending" or "providing" or "storing" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Method and System for a Free Running Strobe Tolerant Interface

Embodiments of the present invention enable a receiving component to strobe received data signals with the received clocking signals, in a source synchronous communication channel, without a priori knowledge of the strobing design of the transmitting component. For example, the receiving component automatically determines that the transmitting component has a center-strobing design or an edge-strobing design by sampling an input data signal. As a result, the receiving component may offset the clocking signals such that the received data signals are strobed according to the determined strobing design of the transmitting component. Thus, the received signals are recovered with minimal error rate or with an error rate that is within an acceptable threshold.

Figure 2:
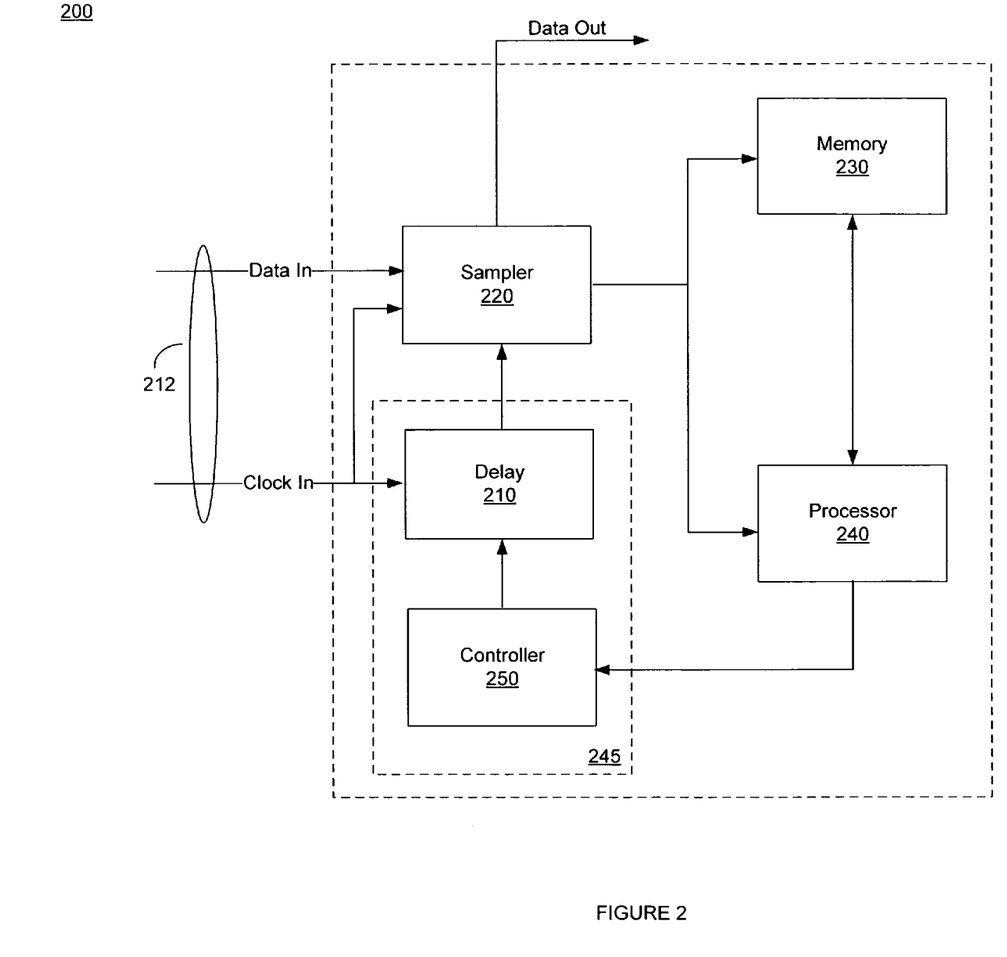
FIG. 2 shows an exemplary receiving component in accordance with one embodiment of the present invention.

Referring now to FIG. 2, an exemplary receiving component 200 in accordance with one embodiment of the present invention is shown. In one embodiment, the receiving component 200 communicates with a transmitting component over a source synchronous communication channel 212. Thus, the receiving component 200 receives a plurality of data signals as well as clocking signals from the transmitting component over channel 212.

According to one embodiment of the present invention, a sampler 220 of the receiving device 200 strobes the plurality of data signals with clocking signals at a plurality of coarse time offset delays. Coarse time offset delays may be a plurality of time offsets that span over a given data bit period. For example, the coarse time offset delays may include four time offset delays, each for strobing data signals at the coarse time offset delays. As a result, the four coarse time offset delays may be located ¼ of a data bit period apart in order to span over any given data bit period. It is appreciated that any number of coarse time offset delays may be used and the four coarse time offset delays described herein are exemplary and should not be construed as limiting the scope of the present invention. It is appreciated that the plurality of coarse time offset delays may be generated by a delay unit 210. It is appreciated that the time offset delay is added to the input clock signal received from 212 and that delayed clock is used to strobe the data.

A memory component 230 may store the strobed or recovered data signals. The sampler 220 sends the strobed data signals to a processor 240 for processing. During initial communication, the data signals are known by the receiver. Alternatively, the processor 240 may access the memory component 230 for processing the strobed data signals. According to one embodiment, the processor 240 may determine the error rates associated with the strobed data signals at each of the coarse time offset delays by comparison to the known data set. The error rates may be used by the processor 240 to determine the strobing design of the transmitting component. For example, the sampler 220 may strobe the plurality of data signals with the clocking signals at four coarse time offset delays (e.g., at the beginning of a data signal, at a quarter of a data signal period, in the middle of the data signal and at three quarter of a data signal period).

Four error rates, each associated with a given coarse time offset delay, may be determined by the processor 240. The coarse time offset delay producing an error rate within an acceptable threshold or an error rate that is the smallest may be chosen as the appropriate coarse time offset delay (e.g., coarse time offset delay in the middle). As a result, the strobing design of the transmitting component may be determined. For example, if the coarse time offset delay in the middle of a data bit produces the smallest error rate, the strobing design of the transmitting component is determined to be center-strobed. It is appreciated that the determination is based on a sufficiently large number of samples to statistically provide an accurate result. It is further appreciated that the initial data signals which are known signals (e.g., training signals) can be of any pattern.

In the above example with four coarse time offset delays, the error rate for the coarse time offset delay at the beginning may be the smallest and the error rates for other coarse time offset delays may become progressively worse before improving close to the end of the data bit period. As a result, the pattern may suggest that the strobing design of the transmitting component is edge-strobed since strobing close to the beginning and the end of each data bit produces the smallest error rate. It is therefore appreciated that other similar techniques may be utilized to determine the strobing design of the transmitting component and that the exemplary methods described herein should not be construed as limiting the scope of the present invention.

In response to the determination of the strobing design of the transmitting component, the processor 240 may send a signal to a recovery unit 245 indicating the time offset to utilize and the determined strobing technique to use for data recovery. The recovery unit 245 is operable to recover the received data signals from the transmitting component such that the recovered data signals have the lowest error rate possible or an error rate that is within an acceptable threshold. It is appreciated that the threshold may be user selected. In one embodiment the threshold is predetermined.

According to one embodiment, the recovery unit 245 comprises a controller 250 and the delay unit 210. The controller 250 may control a plurality of fine time offset delays close to the determined strobing design of the transmitting component such that the best time offset delay can be selected. For example, assuming that the transmitting component utilizes a center-strobed design, the controller 250 may control a plurality of fine time offset delays close to the middle of each of data bit (e.g., ±20% from the middle of each data bit). As such, the controller 250 controls the delay component 210 to generate the plurality of fine time offset delays. Thus, the received clocking signals may be shifted based on the plurality of time offset delays such that the received data signals can be strobed based on the newly shifted clocking signals. This phase of the receiving process is typically referred to as "training."

Referring still to FIG. 2, the sampler 220 strobes the received plurality of data signals based on the shifted clocking signals at the plurality of fine time offset delays as determined by the recovery unit 245. The result may be stored in the memory component 230 and the processor 240 may determine the error rates associated with each of the fine time offset delays. As a result, the controller 250 may use the error rates to determine the appropriate time offset delay for the clocking signals. In one example, the time offset delay may be chosen based on the lowest error rate. Alternatively, the time offset delay may be selected based on the error rate that is within an acceptable threshold. Thus, the delay unit 210 may generate the appropriate time offset delay for the clocking signals such that the received data signals can be appropriately recovered. It is appreciated that once an appropriate time offset delay is selected, the sampler 220 may output the recovered data based on strobing the received data signals with the clocking signals at the selected time offset delay (coarse and fine).

In other words, the receiving component 200 operates in a two stage process. The first stage determines the strobing design of the transmitting component and uses coarse adjustment. The second stage ("training") generates a plurality of fine time delays offsets for fine tuning the clocking signals such that received data signals can be recovered with the lowest error rate or with an error rate that is within an acceptable threshold. It is appreciated that even though the receiving component 200 is described as a two stage process, the two stages may be combined into a single stage operation. As such, the two stage process described herein is exemplary and it is not intended to limit the scope of the present invention.

It is appreciated that even though the embodiments of the present invention are described with respect to the receiving component 200, a transmitter may be equally used in accordance with one embodiment of the present invention. For example, a transmitter may move strobing points based on a receiving the error rates for different delays. Thus, the transmitter can select the best strobing point based on the received error rates. In other words, the transmitter may behave similar to the receiving component 200 described above and select the best strobing point based on the error rates for different delays. Accordingly, it is appreciated that description of embodiment of the present invention with respect to the receiving component 200 should not be construed as limiting the scope of present invention.

Figure 3A:
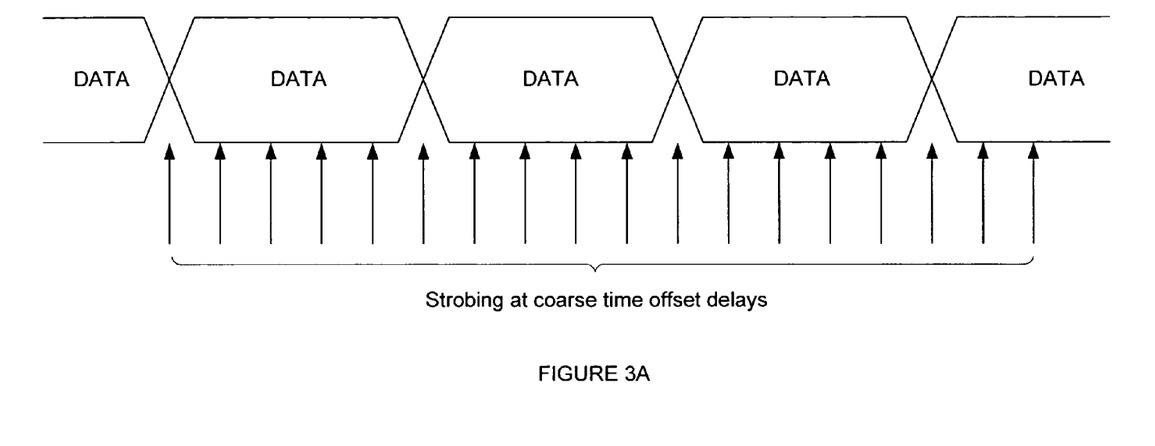
FIGS. 3A and 3B are timing diagrams that show strobing data signals at coarse time offset delays and at a plurality of time offset delays in accordance with one embodiment of the present invention.
Figure 3B:
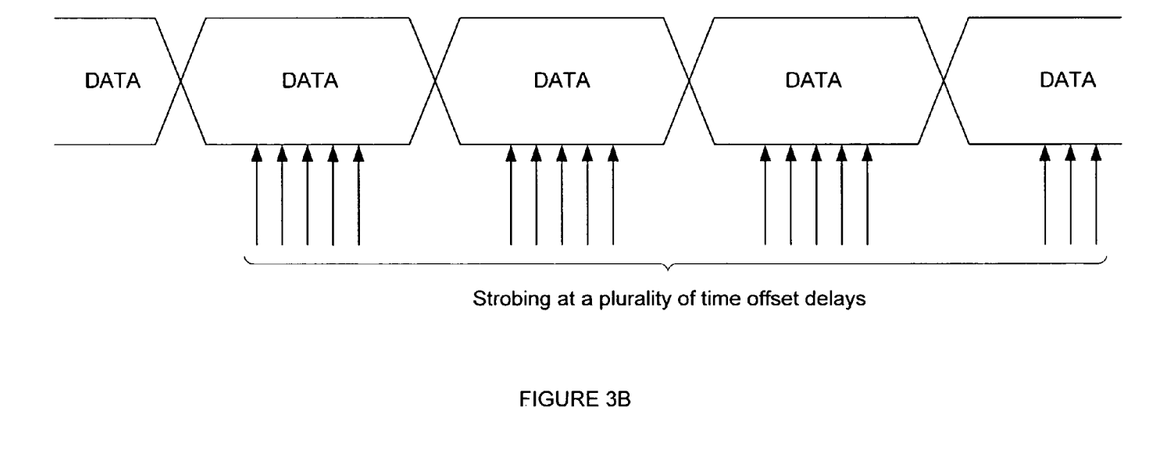

Referring now to FIGS. 3A and 3B, strobing data signals at a plurality of coarse time offset delays and at a plurality of time offset delays in accordance with one embodiment of the present invention are shown. FIG. 3A shows strobing a plurality of data signals with the clocking signals at a plurality of coarse time offset delays. As described above, the plurality of coarse time offset delays are time offset delays that span over each data bit period. In one example, five coarse time offset delays may be used as shown in FIG. 3A. It is appreciated that the number of coarse time offset delays may vary and should not be construed as limiting the scope of the present invention. In general, a coarse delay offset is typically greater than 20% of ¼ clock cycle.

As described above, the error rates associated with strobing data signals with the clocking signals at the plurality of coarse time offset delays may be calculated. In this example, the error rate associated with strobing data signals with the clocking signals at the coarse time offset delays close to the middle of each data bit may be determined to be lower in comparison to the error rates of the coarse time offset delays close to the beginning and the end of data bits. As a result, the strobing design of the transmitting component may be determined to be center-strobed. Once the strobing design of the transmitting component is determined, the time offset delay may be tuned to enable data recovery with minimum error rate or an error rate within an acceptable threshold.

Referring now to FIG. 3B, fine tuning time offset delays based on the determined strobing design of the transmitting component is shown. FIG. 3B is not drawn to scale regarding the fine tuning time offset delays. In the example presented above, it is determined that the strobing design of the transmitting component is center-strobed. As a result, a plurality of fine time offset delays close to the middle of data bits is generated. In this example, five time offset delays are generated. It is appreciated that any number of time offset delays may be used and the five time offset delays are exemplary and it is not intended to limit the scope of the present invention. In general, fine tuning uses time delays that are equal to or less than 20% of ¼ clock cycle.

As described above, error rates associated with each of the fine time offset delays may be calculated. It is appreciated that the number of data bits may vary but a large enough sample is selected to provide statistically accurate results. Accordingly, the time offset delay that produces the error rate that is within an acceptable threshold or an error rate that is the smallest in comparison to other time offset delays may be selected as the proper time offset delay. The threshold may be user selected and/or predetermined. Thus, data signals may be strobed with the clocking signals at the selected time offset delay to recover the received data signals.

It is appreciated that the described process may be repeated throughout data transmission for calibration purposes and to compensate for changes in the communication channel. For example, the time offset delay may be selected at the beginning of data transmission. The process may be repeated after a time period (e.g., a few minutes) to determine that the selected time offset delay is still within the acceptable threshold or has the lowest error rate. As a result, if the selected time offset delay is no longer appropriate, the process is repeated and a new time offset delay may be selected. Therefore, changes in the communication channel may be compensated and data signals with an error rate within an acceptable threshold can be recovered.

Figure 4A:
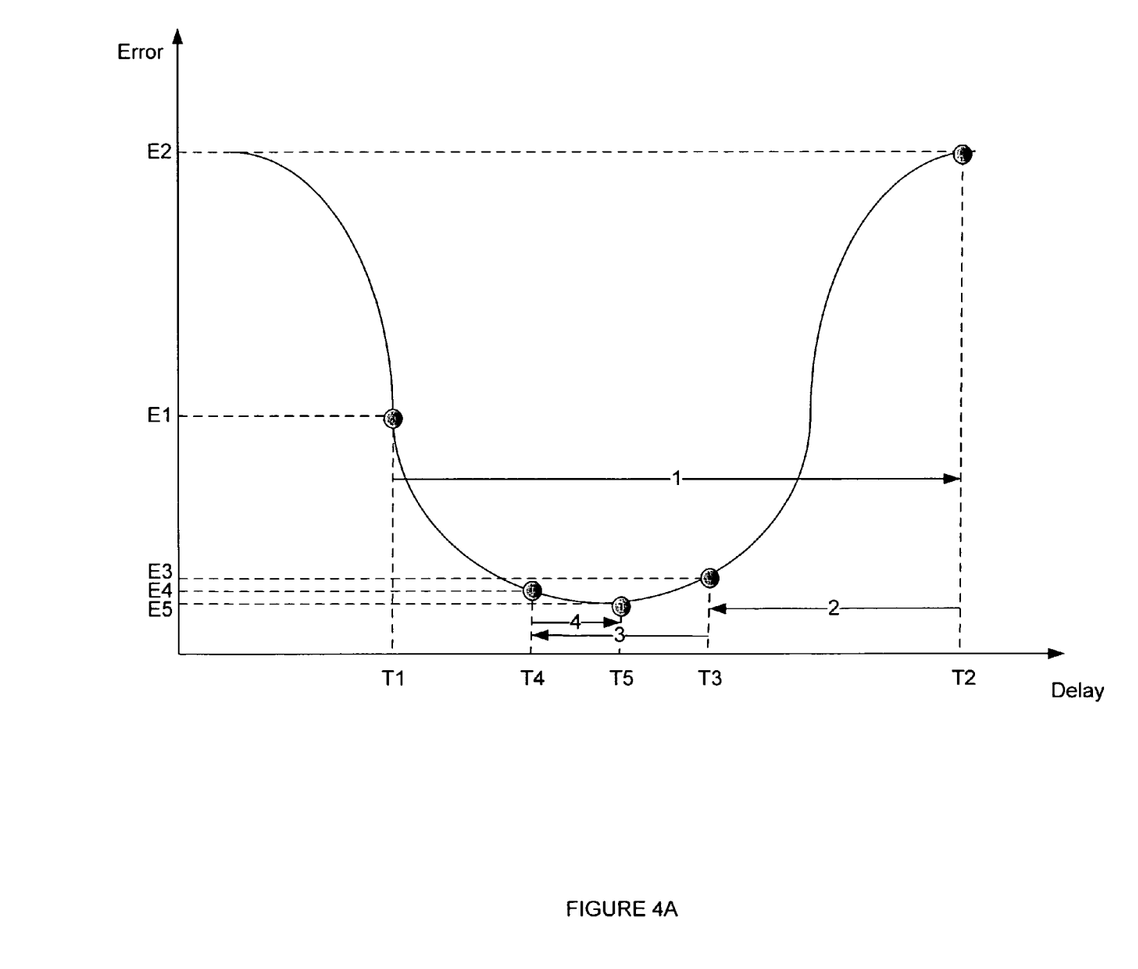
FIGS. 4A and 4B show graphical representations for selecting a time delay offset in accordance with embodiments of the present invention.

Referring now to FIG. 4A, a non-linear graphical representation for selecting a time delay offset in accordance with one embodiment of the present invention is shown. As described above, data signals may be strobed at different coarse time offset delays to determine the strobing design of the transmitting component. In this example, coarse time offset delays include T1 and T2 that span over each data bit. The error rates associated with each of the coarse time offset delay may be determined to be E1 and E2 respectively. The first error rate E1 that is close to the middle of the data bit is smaller than the second error rate E2, which is close to the end of the data bit. Thus, the strobing design of the transmitting component may be determined to be center-strobed.

As described above, once the strobing design is determined, a plurality of fine time offset delays close to the strobing design of the transmitting component are generated. In this example, time offset delay T3 close the strobing design of the transmitting component (e.g., center-strobed) that is between the two coarse time offset delay is generated. The error rate associated with T3 can be calculated to be E3. In this example, another time offset delay (e.g., T4) is generated and its error rate (e.g., E4) is calculated.

In one embodiment of the present invention, the error rates are compared. For example, E1, E3 and E4 are compared. The result of the comparison may indicate that E3 and E4 are smaller than E1. As a result, the next time delay offset generated is between T3 and T4 (e.g., T5). The above described process may be repeated with T5 and its error rate E5 until the time delay offset with the smallest error rate can be determined. Alternatively, the process may terminate when a time offset delay with an error rate that is within an acceptable threshold can be selected. For example, T5 may be selected when the minimum error rate is desired. In comparison, T3, T4 or T5 may be selected if an error rate below E1 is an acceptable threshold error rate.

Figure 4B:
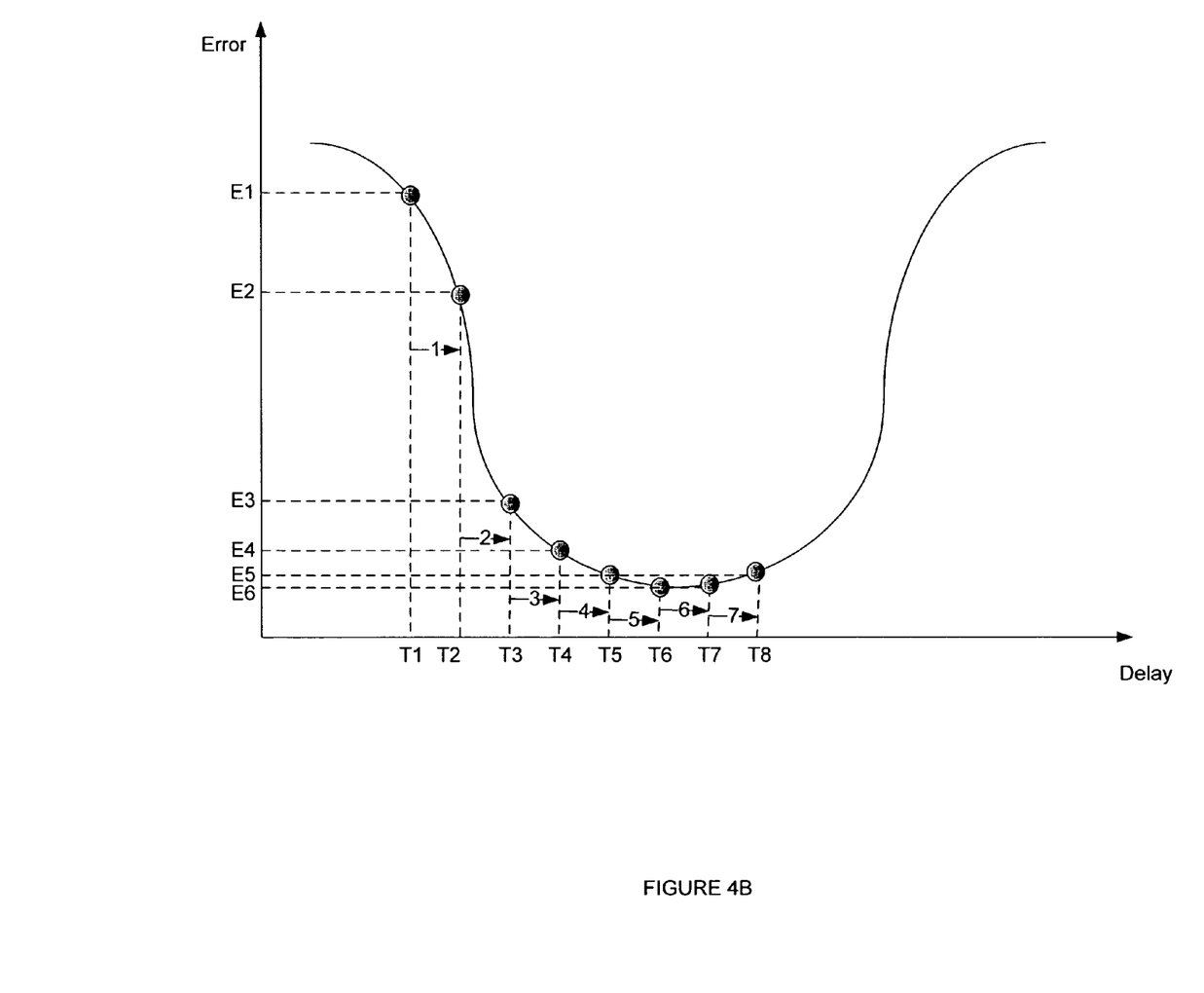

Referring now to FIG. 4B, a linear graphical representation for selecting a time delay offset in accordance with one embodiment of the present invention is shown. In the embodiment of FIG. 4B instead of selecting a plurality of coarse time offset delays, a plurality of time offset delays are selected that increase incrementally (e.g., by a given step size). It is appreciated that the plurality of time offset delays are not necessarily increasing consecutively but merely incrementally.

According to one embodiment, a time offset delay T1 is generated and its error rate E1 is calculated. A second time offset delay T2 that is larger than T1 but within the same data bit period is generated. The error rate associated with T2 is similarly calculated. It is appreciated that the incremental steps are sufficiently small to converge. In this example, E2 is determined to be smaller than E1. Accordingly, a third time offset delay T3 is generated and its error rate E3 is calculated. Similar to before, E3 is determined to be smaller than E2.

In one embodiment of the present invention the process continues until the next error rate increases. For example, the process continues until time offset delay T8 with its corresponding error rate E8. However, comparing E8 with its preceding error rate E7 indicates that E7 is smaller than E8. As such, in one embodiment, the process ends and the time delay offset T7 with its corresponding error E7 is selected. It is appreciated that in some embodiments the process may continue until it is decisive that the error rate is increasing before T7 is selected. It is further appreciated that in some embodiments the process continues until the entire bit data period is swept with time offset delays in which case, the time offset delay having the lowest error rate can be selected.

Figure 5:
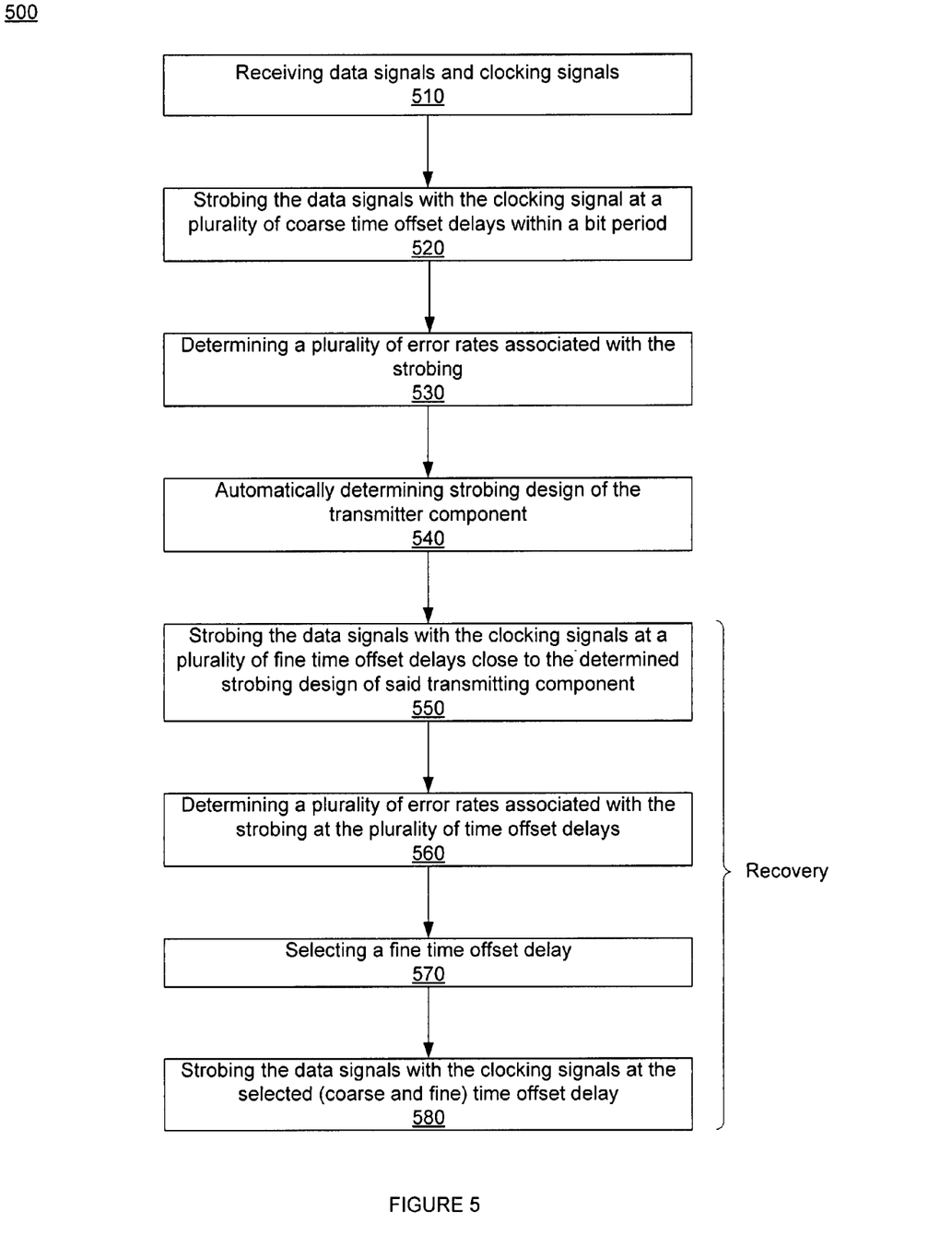
FIG. 5 shows an exemplary flow diagram of a receiving component implementing process for receiving data in accordance with one embodiment of the present invention.

Referring now to FIG. 5, an exemplary flow diagram 500 of a receiving component implementing process for receiving data in accordance with one embodiment of the present invention is shown. At step 510, a plurality of initial data signals and clocking signals are received from a transmitting component. It is appreciated that in one embodiment, the communication between the transmitting component and the receiving component is over a source synchronous channel. At step 520, the receiving component strobes data signals with the clocking signals at a plurality of coarse time offset delays. It is appreciated that the plurality of coarse time offset delays are time offset delays within a bit signal period that span over a bit data.

At step 530, associated error rates for each of the plurality of coarse time offset delays may be determined. Based on the error rates, at step 540, the strobing design of the transmitting component is automatically determined by the reciever. For example, the strobing design of the transmitting component may be determined to be center-strobed if the error rate associated with a coarse time offset delay close to the middle of a bit data produces the lowest error rate. The strobing design of the transmitting component includes center-strobe, edge-strobe and etc. Once the strobing design of the transmitting component is determined, data recovery may be initiated.

At step 550, the plurality of data signals are strobed with the clocking signals at a plurality of fine time offset delays close to the determined strobing design of the transmitting component. Thus at step 560, a plurality of error rates associated with the strobed data signals at step 550 may be determined. At step 570, based on the error rates, a time offset delay may be selected. For example, a time offset delay that results in the lowest error rate may be selected. In one embodiment, a time offset delay that results in an error within an acceptable threshold may be selected. It is appreciated that the threshold may be user selectable and/or predetermined.

As such, at step 580 the received data signals may be recovered by strobing the plurality of data signals with the clocking signals at the selected time offset delay (coarse and fine). It is appreciated that according to one embodiment, this process may be repeated throughout data transmission in order to compensate for variation in the communication channel characteristics.

As a result, the receiving component may automatically determine the strobing design of the transmitting component.

Figure 6:
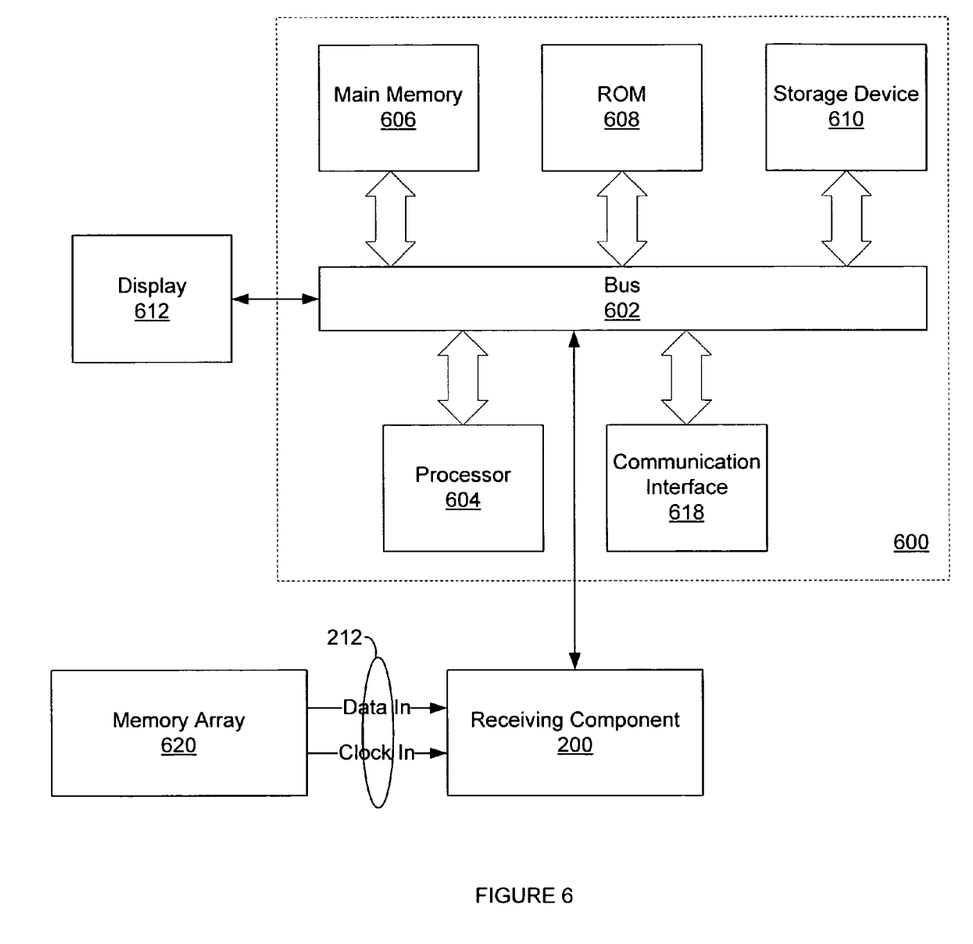
FIG. 6 illustrates a general purpose computer system that may serve as a platform for embodiments of the present invention.

FIG. 6 is a block diagram that illustrates a computer system 600 coupled to a receiving component 200 in accordance with one embodiment of the present invention. Computer system 600 includes a bus 602 or other communication mechanism for communicating information, and a processor 604 coupled with bus 602 for processing information. Computer system 600 may be coupled to the receiving device 200 that receives data signals and clocking signals 212 from a transmitting device, e.g. a memory array 620.

Computer system 600 also includes a main memory 606, such as a random access memory (RAM) or other dynamic storage device, coupled to bus 602 for storing information and instructions to be executed by processor 604. Main memory 606 also may be used for storing temporary variables or other intermediate information during execution of instructions to be executed by processor 604. Computer system 600 further includes a read only memory (ROM) 608 or other static storage device coupled to bus 602 for storing static information and instructions for processor 604. A non-volatile storage device 610, such as a magnetic disk or optical disk, is provided and coupled to bus 602 for storing information and instructions and may store the persistent internal queue. According to one embodiment, the instructions for implementing the virtual device may be stored on any one of the memory components (e.g., RAM, ROM, non-volatile storage device and etc.). Computer system 600 may be coupled via bus 602 to an optional display 612, such as a cathode ray tube (CRT), for displaying information to a computer user.

The term "computer-readable medium" as used herein refers to any medium that participates in providing instructions to processor 604 for execution. Such a medium may take many forms, including but not limited to, non-volatile media, volatile media, and transmission media. Non-volatile media includes, for example, optical or magnetic disks, such as storage device 610. Volatile media includes dynamic memory, such as main memory 606. Transmission media includes coaxial cables, copper wire and fiber optics, including the wires that comprise bus 602. Transmission media can also take the form of acoustic or light waves, such as those generated during radio wave and infrared data communications.

Common forms of computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

In the foregoing specification, embodiments of the invention have been described with reference to numerous specific details that may vary from implementation to implementation. Thus, the sole and exclusive indicator of what is, and is intended by the applicants to be, the invention is the set of claims that issue from this application, in the specific form in which such claims issue, including any subsequent correction. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A method of receiving data comprising:
    receiving a plurality of data signals and clocking signals from a transmitting component over a source synchronous communication channel;
    strobing said plurality of data signals with said clocking signals at a plurality of coarse time offset delays within a bit period simultaneously;
    determining a plurality of error rates associated with said strobing said plurality of data signals with said clocking signals at said plurality of coarse time offset delays;
    based on said plurality of error rates, automatically determining a strobing design of said transmitter component; and
    recovering data from said data signals using said strobing design.

2. The method as described in claim 1, wherein said strobing design of said transmitter component is selected from a group consisting of an edge-strobe design and a center-strobe design.

3. The method as described in claim 1 wherein said recovering comprises:
    strobing said plurality of data signals with said clocking signals at a plurality of fine time offset delays close to said determined strobing design of said transmitting component;
    determining a plurality of error rates associated with said strobing said plurality of data signals with said clocking signals at said plurality of fine time offset delays;
    selecting a time offset delay based on said plurality of error rates associated with said strobing said plurality of data signals with said clocking signals at said plurality of time offset delays; and
    strobing said data signals with said clocking signals at said selected time offset delay.

4. The method as described in claim 3, wherein said selected time offset delay generates the lowest error rate in comparison to the remainder of said plurality of time offset delays.

5. The method as described in claim 3, wherein said selected time offset delay generates an error rate within a given threshold.

6. The method as described in claim 5, wherein said given threshold is user selected.

7. The method as described in claim 5, wherein said threshold is predetermined.

8. A receiver implemented method of receiving data comprising:
- receiving a plurality of data signals and clocking signals from a transmitting component over a communication bus;
- strobing said plurality of data signals with said clocking signals at a plurality of coarse time offset delays within a bit period simultaneously;
- determining a plurality of error rates associated with said strobing said plurality of data signals with said clocking signals at said plurality of coarse time offset delays;
- based on said plurality of error rates, automatically determining a strobing protocol of said transmitter component; and
- recovering data from said plurality of data signals based on said strobing protocol.

9. The method as described in claim 8, wherein said strobing protocol of said transmitter component is selected from a group consisting of an edge-strobe design and a center-strobe design.

10. The method as described in claim 8 wherein said recovering comprises:
- strobing said plurality of data signals with said clocking signals at a plurality of fine time offset delays close to said determined strobing design of said transmitting component;
- determining a plurality of error rates associated with said strobing said plurality of data signals with said clocking signals at said plurality of fine time offset delays;
- selecting a time offset delay based on said plurality of error rates associated with said strobing said plurality of data signals with said clocking signals at said plurality of fine time offset delays; and
- strobing said data signals with said clocking signals at said selected time offset delay.

11. The method as described in claim 10, wherein said selected time offset delay generates the lowest error rate in comparison to the remainder of said plurality of time offset delays.

12. The method as described in claim 10, wherein said selected time offset delay generates an error rate within a given threshold.

13. The method as described in claim 12, wherein said given threshold is user selected.

14. The method as described in claim 12, wherein said threshold is predetermined.

15. A receiver device comprising:
- a sampler for coupling to a bus and operable to strobe a plurality of data signals with clocking signals at a plurality of coarse time offset delays simultaneously, wherein said plurality of data signals and said clocking signals are over said bus;
- a processor operable to determine a plurality of error rates associated with said strobing, and wherein said processor based on said determined plurality of error rates automatically determines a strobing design of a transmitting component of said plurality of data signals; and
- a recovery unit for recovering data from said plurality of data signals based on said strobing design.

16. The device as described in claim 15, wherein said bus is a source synchronous bus and wherein further said strobing design of said transmitter component is selected from a group consisting of an edge-strobe design and a center-strobe design.

17. The device as described in claim 15, wherein said recovery unit comprises:
- a controller operable to control a plurality of fine time offset delays close to said determined strobing design of said transmitting component; and
- a delay component operable to generate said plurality of fine time offset delays in response to said controller;
- wherein said controller responsive to error rates associated with strobing said plurality of data signals with said clocking signals at said plurality of fine time offset delays determines a time offset delay for said clocking signals and said delay component in response to said controller generating said time offset delay.

18. The device as described in claim 17 further comprising:
a memory component operable to store said data.

19. The device as described in claim 17, wherein said time offset delay generates an error rate within a given threshold.

20. The device as described in claim 19, wherein said threshold is user selectable.

21. The device as described in claim 19, wherein said processor is operable to determine whether said strobing design comprises at least one of edge-strobe design and center-strobe design based said plurality of coarse time offset delays.

* * * * *